United States Patent
Tseng

(10) Patent No.: US 6,537,880 B1
(45) Date of Patent: Mar. 25, 2003

(54) METHOD OF FABRICATING A HIGH DENSITY NAND STACKED GATE FLASH MEMORY DEVICE HAVING NARROW PITCH ISOLATION AND LARGE CAPACITANCE BETWEEN CONTROL AND FLOATING GATES

(75) Inventor: Horng-Huei Tseng, Hsin-Chu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/950,609

(22) Filed: Sep. 13, 2001

(51) Int. Cl.[7] ............... H01L 21/336; H01L 21/3205; H01L 21/4763
(52) U.S. Cl. .................. 438/260; 438/594; 438/596
(58) Field of Search .................. 438/260, 594, 438/596

(56) References Cited

U.S. PATENT DOCUMENTS

| | | | | |
|---|---|---|---|---|
| 5,432,112 A | * | 7/1995 | Hong | 257/315 |
| 6,013,551 A | | 1/2000 | Chen et al. | 438/264 |
| 6,171,909 B1 | | 1/2001 | Ding et al. | 438/267 |
| 6,204,126 B1 | | 3/2001 | Hsieh et al. | 438/267 |
| 6,235,586 B1 | | 5/2001 | Au et al. | 438/258 |
| 6,235,589 B1 | * | 5/2001 | Meguro | 438/267 |

OTHER PUBLICATIONS

K. Shimizu et al., "A Novel High–Density SF2 NAND STI Cell Technology Suitable For 256 Mbit and 1Gbit Flash Memories," IEEE (C) 1997, pp. 5–13.

Jung–Dal Choi et al., "A 0.15μm NAND Flash Technology with 0.11μm² Cell Size For 1 Gbit Flash Memory," IEEE (C) 2000, pp. 10–13.

* cited by examiner

*Primary Examiner*—Wael Fahmy
*Assistant Examiner*—Howard Weiss
(74) *Attorney, Agent, or Firm*—George O. Saile; Stephen B. Ackerman

(57) ABSTRACT

A process for fabricating a flash memory cell with increased floating gate to control gate overlap, has been developed. The process features forming the active device region of the flash memory cell in a narrow space of a semiconductor substrate, located between STI regions. The increased overlap is achieved via formation of a floating gate structure comprised with vertical conductive spacers, extending upwards from the periphery of an underlying floating gate base structure. Novel process sequences are used to simultaneously form the vertical conductive spacers and the floating gate base structure.

23 Claims, 4 Drawing Sheets

METHOD OF FABRICATING A HIGH DENSITY NAND STACKED GATE FLASH MEMORY DEVICE HAVING NARROW PITCH ISOLATION AND LARGE CAPACITANCE BETWEEN CONTROL AND FLOATING GATES

BACKGROUND OF THE INVENTION (1) Field of the Invention

The present invention relates to methods used to fabricate semiconductor devices, and more specifically to a method of fabricating a NAND flash memory device.

(2) Description of Prior Art

The objective of reducing device cell size to allow a greater number of smaller semiconductor chips to be obtained from a specific size starting substrate, has been positively influenced by the use of shallow trench isolation (STI), technology. The ability to form STI regions, comprised of insulator filled shallow trench shapes, allows the allotted space for the STI regions to be reduced when compared to LOCOS, (localized oxidation of silicon), counterparts, which consume more space and also produce undesirable "birds beak", or unwanted insulator extensions into subsequent active device regions. The smaller semiconductor chips, still comprised with device densities equal to, or greater than, counterpart, larger semiconductor chips, result in a decrease in the fabrication cost for a specific semiconductor chip as a result of obtaining a greater number of semiconductor chips from a specific size starting substrate. The smaller semiconductor chips, comprised with smaller features, also result in performances increases arising from reductions in performance degrading junction capacitance.

Flash memory devices have also been formed using STI regions, resulting in decreases in the cell size of these devices, allowing for integration of smaller, flash memory cells on a semiconductor substrate. However the coupling ratio of the flash memory device is reduced as the cell size becomes smaller. Higher coupling ratios allow more efficient read, write and erase cycles to achieved. The decrease in coupling ratio, when fabricating smaller cell size, flash memory devices, is attributed to less overlap between the control gate and the floating gate. This invention will describe a process for fabricating a flash memory cell, using STI regions, however compensating for the reduction in horizontal overlap between the control gate and the floating gate, by increasing the overlap between these structures vertically. Prior art, such as Ding et al, in U.S. Pat. No. 6,171,909, describe a process for increasing coupling ratio via use of vertical conductive spacers, formed on the sides of the floating gate structure. However that prior art does not describe key features used in this present invention, such as the simultaneous definition of the floating gate, and the conductive spacer features extending upwards from the edges of the underlying floating gate structure.

SUMMARY OF THE INVENTION

It is an object of this invention to fabricate high density, NAND flash memory devices having narrow pitch as a result of STI isolation.

It is another object of this invention to increase the coupling ratio of the NAND flash memory device via capacitance increases resulting from increased overlap between the control and floating gate structures.

It is still another object of this invention to simultaneously define a floating gate structure, and conductive vertical features protruding upward from the periphery of the floating gate structure, allowing increased overlap between an overlying control gate structure, and the floating gate structure comprised with the protruding vertical features, to be realized.

In accordance with the present invention a method of fabricating a flash memory device featuring the simultaneous definition of a floating gate structure, and conductive features protruding from upwards from the periphery of the floating gate structure, allowing increased overlap between a control gate, and the underlying floating gate structure to be realized, is described. After formation of STI regions, a tunnel insulator layer is grown on the region of a semiconductor substrate not occupied by the STI regions. A first conductive layer is deposited followed by definition of an insulator shape overlying the first conductive layer. A second conductive layer is deposited followed by an anisotropic dry etch procedure resulting in conductive spacers defined on the sides of the insulator shape, located overlying top portions of the underlying first conductive layer. The anisotropic dry etch procedure is continued to remove portions of the first conductive layer not covered by the insulator shape or by the conductive spacers, resulting in a floating gate structure featuring a base comprised from the first conductive layer and conductive spacers, formed from the second conductive layer, located on, and protruding upwards from, the floating gate base. Source/drain regions are next formed in regions of the semiconductor substrate not covered by the floating gate structure. After selective removal of the insulator shape a thin dielectric layer is formed on the floating gate structure. A third conductive layer is then deposited and defined to form a control gate structure on the underlying thin dielectric layer, resulting in a flash memory device featuring increased overlap between the control gate and floating gate structures as a result of the vertical protruding features of the floating gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
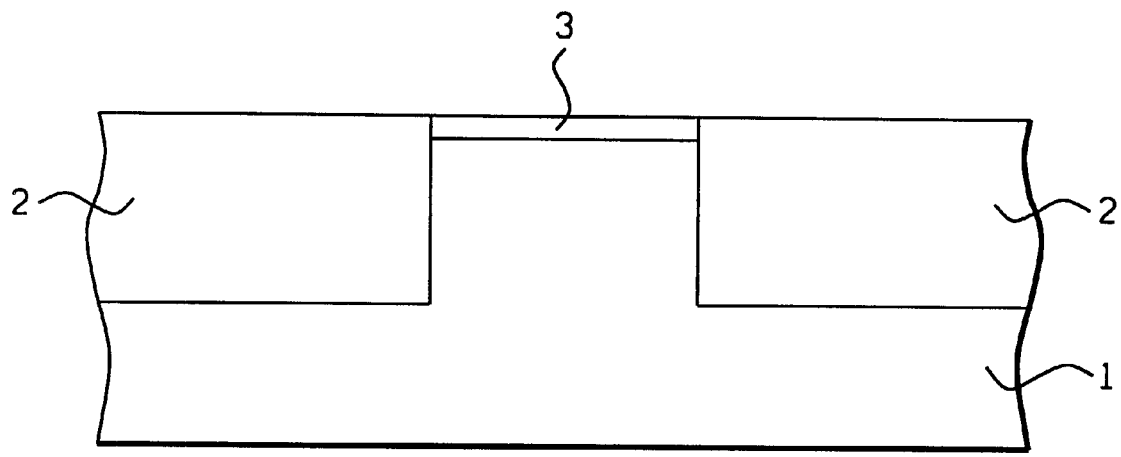
FIGS. 1–6, and 7B, which schematically, in cross-sectional style, show key stages of fabrication for the flash memory device, featuring a floating gate structure comprised with protruding vertical features allowing increased capacitance to be realized via the increased overlap between floating gate and control gate structures.

The method of fabricating a high density flash memory device, featuring increased capacitance achieved via use of a floating gate structure comprised with protruding conductive features, formed simultaneously with the floating gate base structure, will now be described in detail. Semiconductor substrate 1, comprised of P type, single crystalline silicon, shown schematically in FIG. 1, is used to accommodate shallow trench isolation (STI), regions 2. Shallow trench shapes are first defined via photolithographic and an isotropic, reactive ion etching (RIE), procedures, using $Cl_2$ or $SF_6$ as an etchant, to a depth between about 1000 to 5000 Angstroms, in semiconductor substrate 1. After removal of the photoresist shape used for definition of the shallow trench shapes, a silicon oxide layer is deposited via low pressure chemical vapor deposition (LPCVD), or via plasma enhanced chemical vapor deposition (PECVD), procedures, completely filling the shallow trench shapes. Removal of portions of the silicon oxide layer from the top surface of semiconductor substrate 1, is accomplished via a chemical mechanical polishing (CMP), procedure, resulting in the finalization of STI regions 2. The narrow space between STI regions, used for the active device region, between about 0.05 to 0.50 um, as well as the narrow width of STI regions 2, between about 0.1 to 10 um, allows increased density of a flash memory cell to be realized. After wet chemical cleans, used to remove organic as well as metallic impurities from the surface of semiconductor substrate 1, tunnel insulator layer 3, is formed. Tunnelling insulator layer 3, comprised of silicon dioxide, is thermally grown in an oxygen—steam ambient, to a thickness between about 30 to 150 Angstroms. This is schematically shown in FIG. 1.

Figure 2:
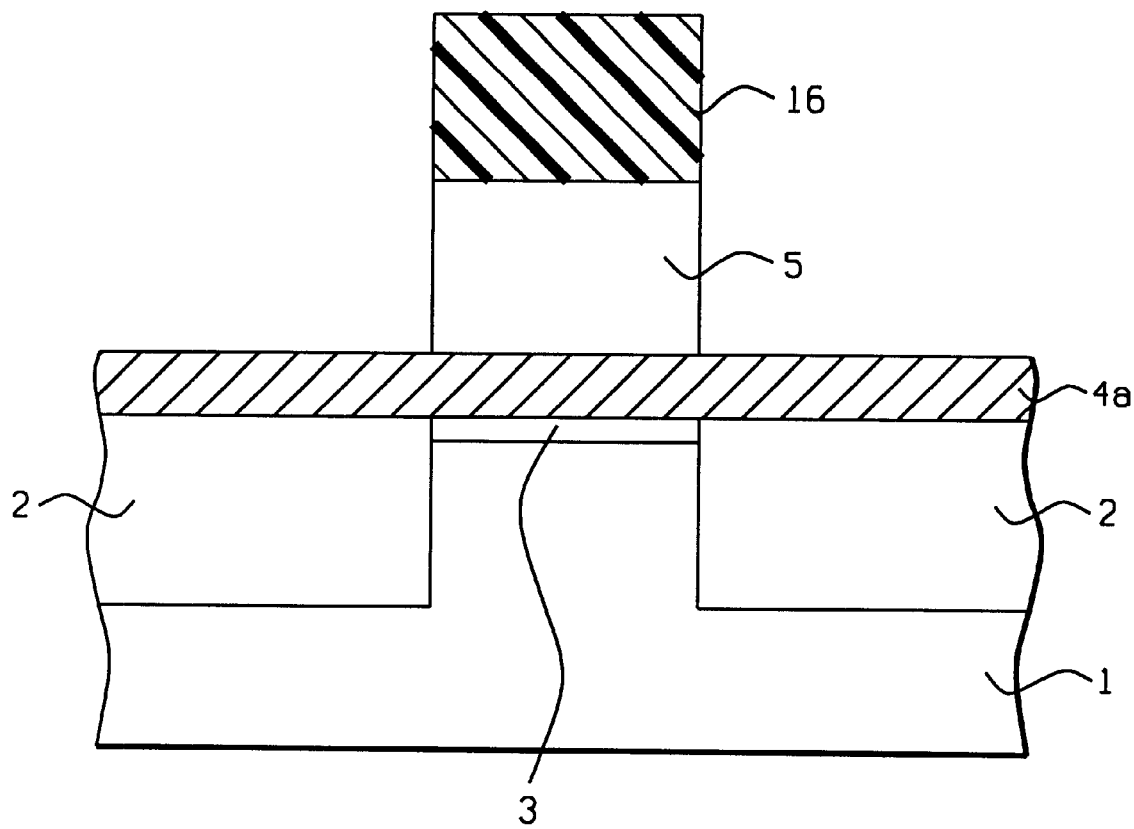

First conductive layer 4a, comprised of polysilicon and obtained via LPCVD procedures to a thickness between about 1000 to 3000 Angstroms, is next deposited, and doped in situ, during deposition via the addition of arsine, or phosphine, to a silane ambient. An insulator layer such as silicon nitride, is next deposited on first conductive layer 4a, via PECVD or LPCVD procedures, to a thickness between about 1000 to 4000 Angstroms. It is critical that the thickness of the insulator, or silicon nitride layer be greater than the thickness of first conductive layer 4a, so that subsequent etching of conductive layer 4a, does not completely remove the conductive spacers formed on the sides of an insulator shape defined from the insulator layer. Photoresist shape 16, is then formed and used as an etch mask to allow an anisotropic RIE procedure, using $Cl_2$ or $CF_4$ as an etchant for the insulator layer, to define insulator shape 5, located on first conductive layer 4a, in a region directly overlying the space between STI regions 2. This is schematically shown in FIG. 2. Photoresist shape 16, is then removed via plasma oxygen ashing procedures.

Figure 3:
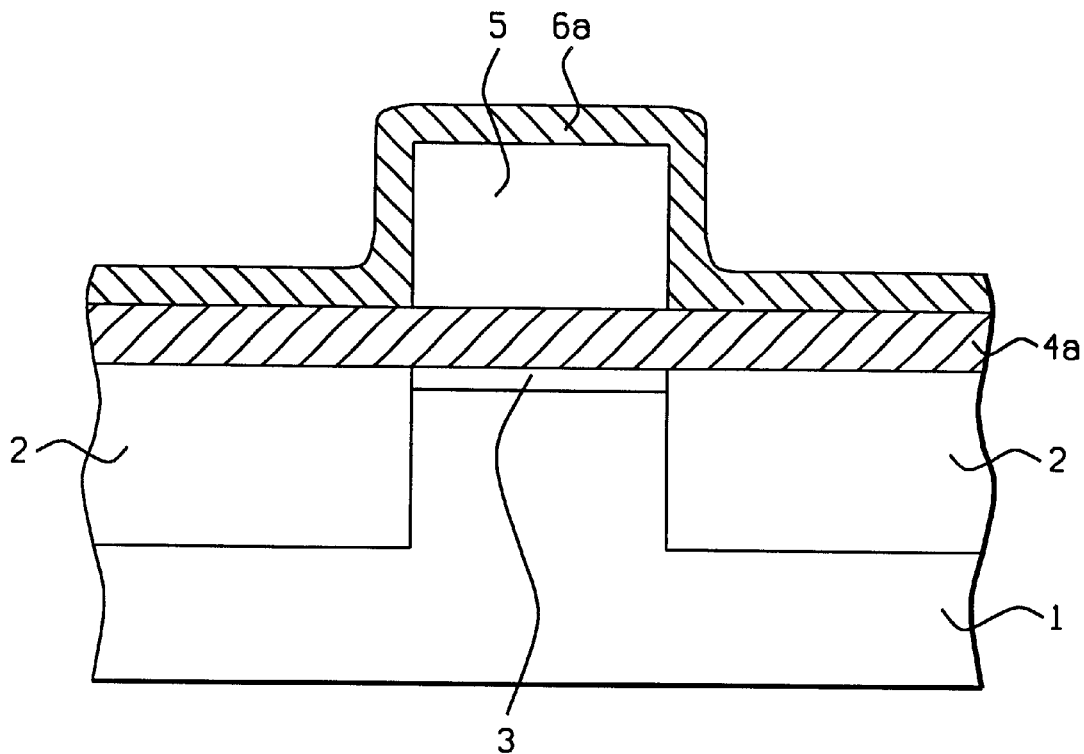

A second conductive layer 6a, again preferably comprised of polysilicon, is conformally deposited on insulator shape 5, and on the portions of conductive layer 4a, not covered by insulator shape 5. Second conductive layer 6a, or polysilicon layer 6a, shown schematically in FIG. 3, is obtained via LPCVD procedures at a thickness between about 300 to 2500 Angstroms, and doped in situ during deposition via the addition of arsine, or phosphine, to a silane ambient.

Figure 4:
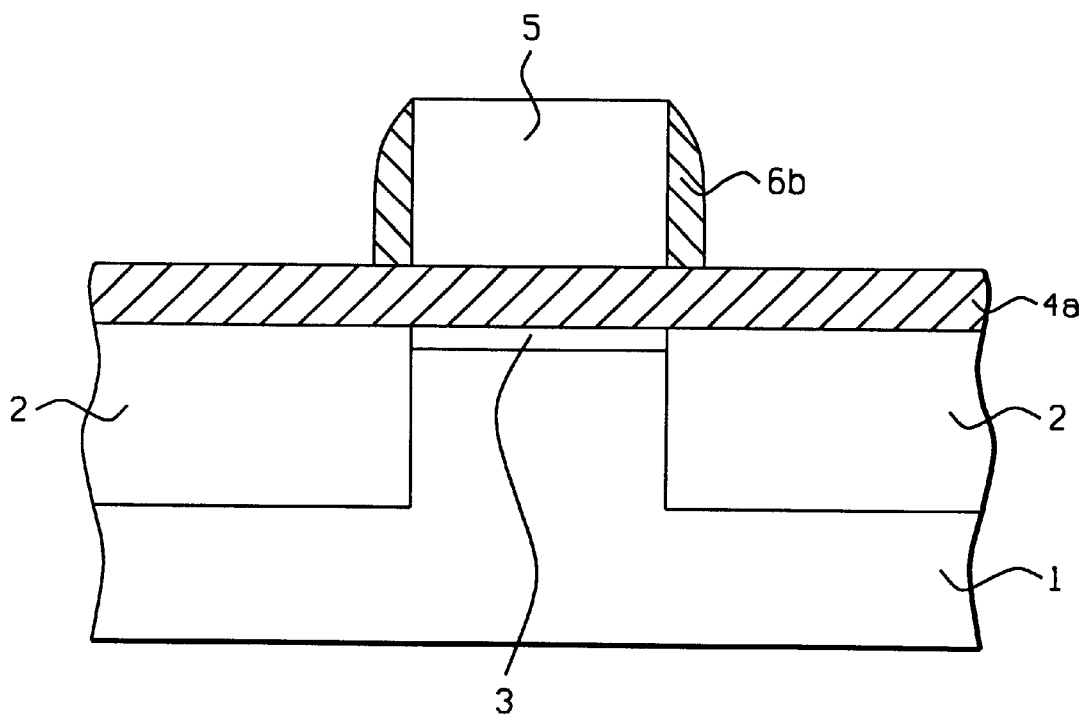
Figure 5:
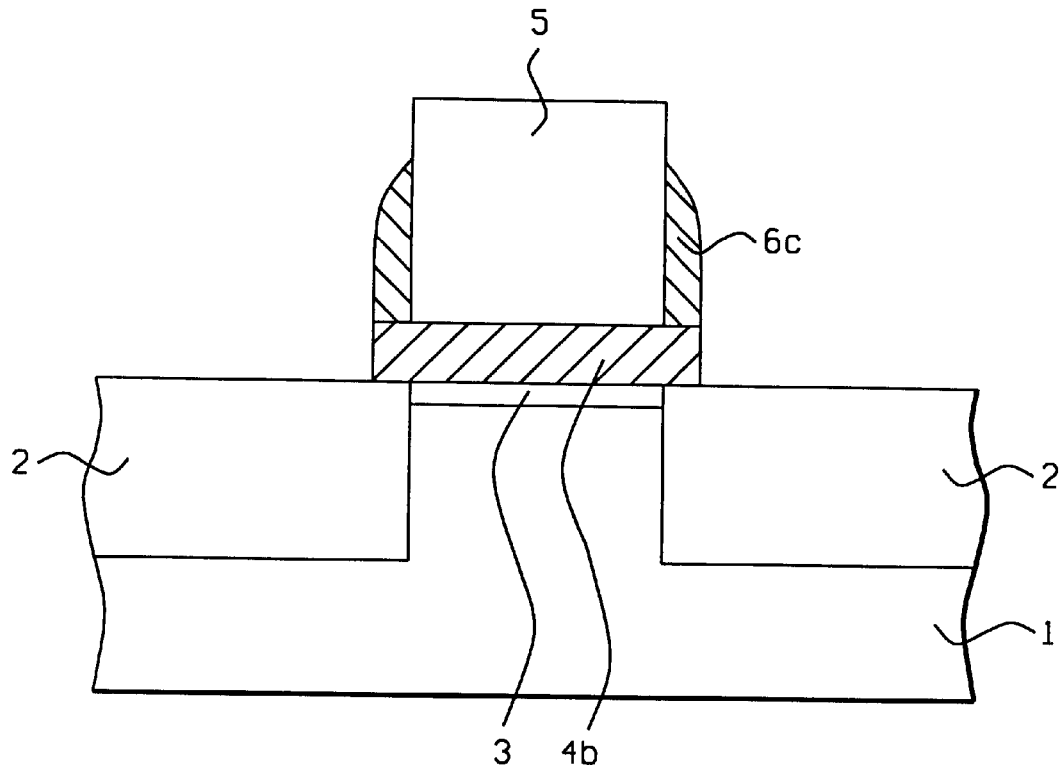

A first cycle of an anisotropic RIE procedure, is next performed using $Cl_2$ or $SF_6$ as an etchant for polysilicon, resulting in the formation of conductive spacers 6b, located on the sides of insulator shape 5, and overlying portions of underlying first conductive layer 4a. This is schematically shown in FIG. 4. A second cycle of the anisotropic RIE procedure is then performed, selectively removing the portions of first conductive layer 4a, not covered by insulator shape 5, or by conductive spacers 6b. The second cycle of the anisotropic RIE procedure is again performed using either $Cl_2$ or $SF_6$ as a selective etchant for polysilicon, terminating at the appearance of the top surface of insulator layer 2, and of insulator shape 5. This cycle simultaneously defines the components of the floating gate structure comprised of floating gate base structure 4b, and conductive spacers 6c, located overlying, and protruding upwards from the periphery of floating gate base structure 4b. Conductive spacers 6c, previously equal to the thickness of insulator shape 5, have now been thinned to between about 100 to 1000 Angstroms, as a result of being exposed to the second cycle of the anisotropic RE procedure. The result of the second cycle of the anisotropic RIE procedure is schematically shown in FIG. 5. At this stage of the fabrication procedure a source/drain region, not shown in the drawings, is formed in regions of semiconductor substrate 1, not covered by the floating gate structure, or not occupied by STI regions 2. The source/drain regions are formed via implantation of arsenic or phosphorous ions.

Figure 6:
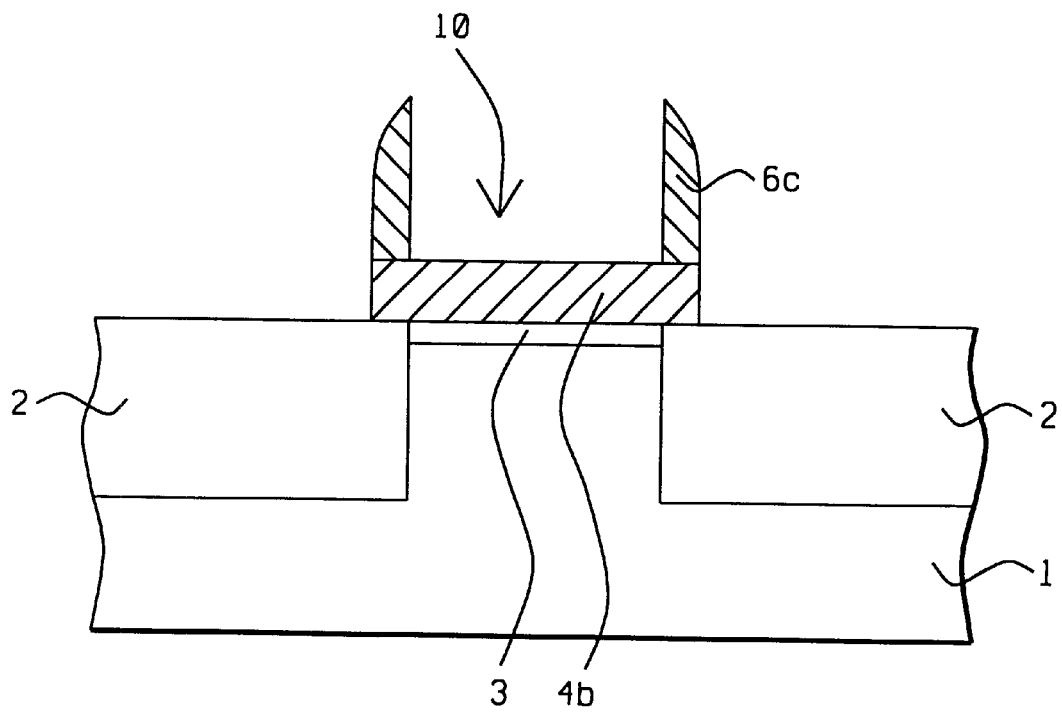

Selective removal of insulator shape 5, comprised of silicon nitride, is next addressed via use of a hot phosphoric acid solution, resulting in the exposure of floating gate structure 10, comprised of floating gate base structure 4b, and simultaneously defined conductive spacers 6c. This is schematically shown in FIG. 6.

Figure 7A:
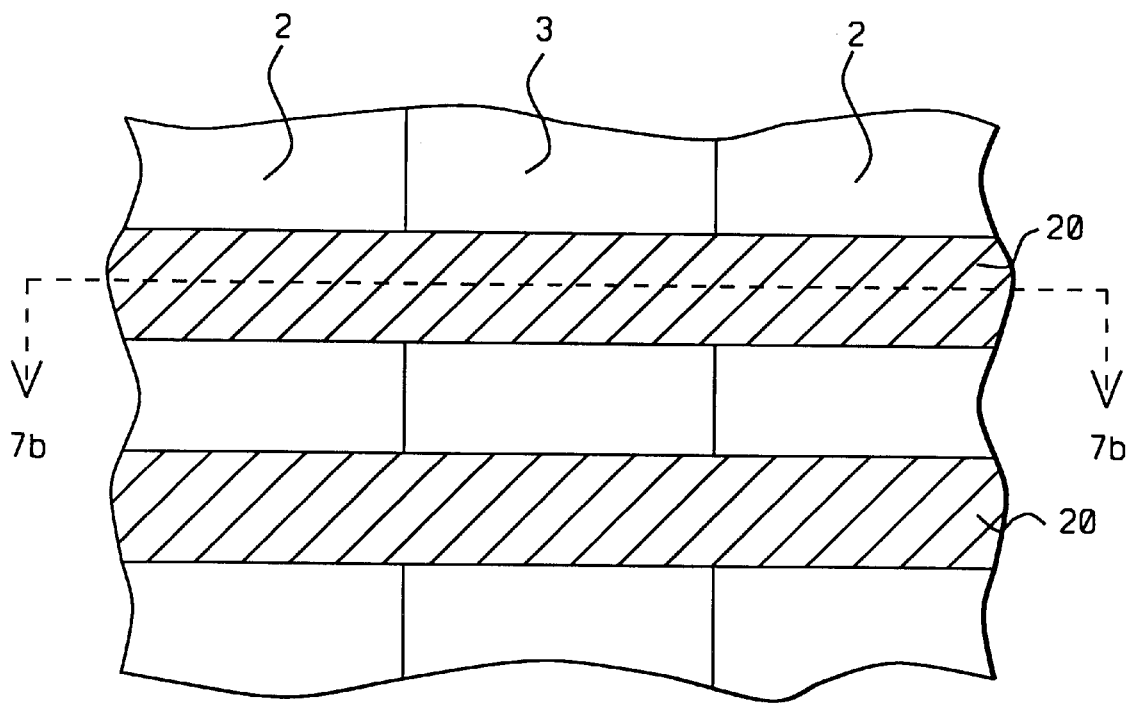
FIG. 7A, which schematically shows a top view of the flash memory device described in this present invention.
Figure 7B:
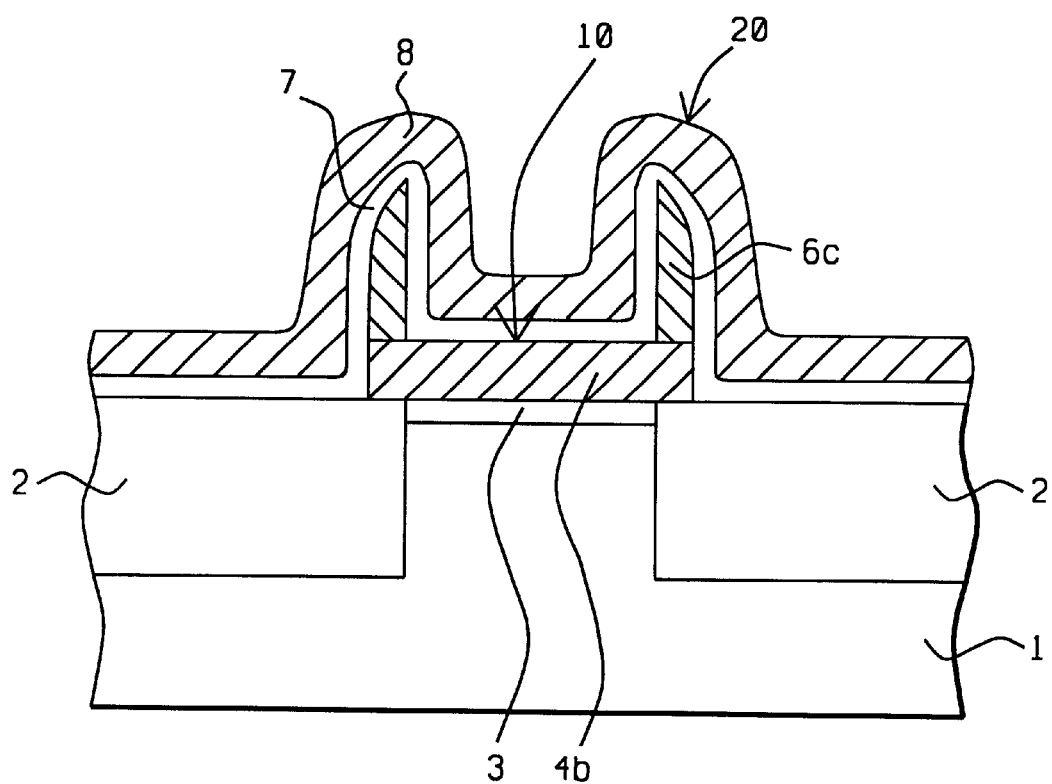

Thin, dielectric layer 7, such as an oxidized silicon nitride (NO) layer, or an oxidized silicon nitride on silicon oxide (ONO) layer, at an equivalent silicon dioxide thickness between about 80 to 200 Angstroms, is next formed, completely covering floating gate base structure 10. The NO option is accomplished via deposition of a thin silicon nitride layer, followed by thermal oxidation of a top portion of the thin silicon nitride layer. The ONO option employs a thin silicon nitride layer, on a thin underlying, chemically vapor deposited silicon oxide layer, again followed by thermal oxidation of a top portion of the thin silicon nitride layer. A third conductive layer comprised of either polysilicon, polycide (metal silicide on polysilicon), or metal, is next deposited. The polysilicon option is obtained via deposition of a polysilicon layer, via LPCVD procedures at a thickness between about 500 to 2000 Angstroms, and doped in situ during deposition via the addition of arsine, or phosphine to a silane ambient. Conventional photolithographic and RIE procedures, using $Cl_2$ or $SF_6$ as an etchant, are used to define control gate structure 8, completely overlying floating gate structure 10. This is schematically shown in cross-sectional form in FIG. 7B, while schematically shown for the top view in FIG. 7A. Flash memory device 20, is now comprised of control gate 8, dielectric layer 7, and floating gate structure 10, wherein the overlap between control gate 8, and floating gate structure 10, was increased as a result of conductive spacers 6c, which in turn were simultaneously formed during the formation of floating gate base structure 4b. The coupling ratio of this device, featuring a floating gate structure comprised with conductive spacers, is higher than the coupling ratio of counterpart flash memory devices, formed without conductive spacer components. In addition the narrow spaces, or active device regions, located between the STI regions allow the size of a flash memory device to be minimized, thus allowing increased flash memory cell density to be achieved.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a flash memory device on a semiconductor
   substrate, comprising the steps of:
   forming shallow trench isolation (STI) regions in first portions of said semiconductor substrate;
   forming a first dielectric layer on a second portion of said semiconductor substrate, wherein said second portion is not occupied by said STI regions;
   depositing a first conductive layer;
   forming an insulator shape on said first conductive layer, in an area in which said first conductive layer overlays said first dielectric layer, wherein the thickness of said insulator shape is greater than the thickness of said first conductive layer;

depositing a second conductive layer, in situ doped during deposition;

applying a first anisotropic dry etching procedure to said second conductive layer to form conductive spacers on the sides of said insulator shape;

performing a second anisotropic dry etch procedure to remove regions of said first conductive layer not covered by said insulator shape, or by said conductive spacers, and to thin said conductive spacers, forming a floating gate structure comprised of a floating gate base structure, formed from said first conductive layer, and comprised of thinned conductive spacers, located extending upwards from the periphery of said floating gate base structure;

removing said insulator shape, via wet etch procedures;

forming a second dielectric layer on said floating gate structure; and forming a control gate structure on said second dielectric layer, overlapping said floating gate structure.

2. The method of claim 1, wherein said STI regions are between about 0.10 to 10 um, in width, with a space between said STI regions of about 0.05 to 0.50 um, and defined to a depth between about 1000 to 5000 Angstroms, in said semiconductor substrate.

3. The method of claim 1, wherein said first dielectric layer, used as a tunnel insulator layer, is comprised of silicon dioxide, obtained via thermal oxidation procedures, in an oxygen—steam ambient, at a thickness between about 30 to 150 Angstroms.

4. The method of claim 1, wherein said first conductive layer is a polysilicon layer, obtained via LPCVD procedures at a thickness between about 1000 to 3000 Angstroms, and doped in situ during deposition via the addition of arsine, or phosphine to a silane ambient.

5. The method of claim 1, wherein said insulator shape is comprised of silicon nitride, formed at a height between about 1000 to 4000 Angstroms from a silicon nitride layer which in turn was obtained at a thickness between about 1000 to 4000 Angstroms via LPCVD or PECVD procedures, then defined via anisotropic, reactive ion etching (RIE), procedure, using $Cl_2$ or $CF_4$ as an etchant for silicon nitride.

6. The method of claim 1, wherein said second conductive layer is a polysilicon layer, obtained via LPCVD procedures to a thickness between about 300 to 2500 Angstroms, and doped in situ during deposition via the addition of arsine, or phosphine to a silane ambient.

7. The method of claim 1, wherein said first anisotropic dry etching procedure, used to form said conductive spacers, is an anisotropic RIE procedure using $Cl_2$ or $SF_6$ as an etchant for said second conductive layer.

8. The method of claim 1, wherein said second anisotropic dry etching procedure used to form said floating gate structure is performed using $Cl_2$ or $SF_6$ as an etchant for said first conductive layer.

9. The method of claim 1, wherein the height or thickness of said thinned conductive spacers are between about 100 to 1000 Angstroms.

10. The method of claim 1, wherein said second dielectric layer is formed at an equivalent silicon dioxide thickness between about 80 to 200 Angstroms, and comprised of either an oxidized silicon nitride (NO) layer, or comprised of an oxidized silicon nitride layer on silicon oxide (ONO).

11. The method of claim 1, wherein said control gate structure is defined from a polysilicon layer in turn obtained via LPCVD procedures to a thickness between about 500 to 2000 Angstroms, and doped in situ during deposition via the addition of arsine, or phosphine to a silane ambient.

12. A method of fabricating a flash memory device on a semiconductor substrate, featuring increased overlap between an overlying control gate structure and an underlying floating gate structure, comprising the steps of:

forming shallow trench isolation (STI) regions in first portions of said semiconductor substrate;

forming a silicon dioxide tunnelling layer on a second portion of said semiconductor substrate, wherein said second portion is not occupied by said STI regions;

depositing a first polysilicon layer;

forming a silicon nitride shape on said first polysilicon layer, in an area in which said first polysilicon layer overlays a portion of said second region of said semiconductor substrate, wherein the thickness of said silicon nitride shape is greater than the thickness of said first polysificon layer;

depositing an in situ doped, second polysilicon layer;

performing a first anisotropic reactive ion etch (RIE) procedure on portions of said second polysilicon layer to form polysilicon spacers on the sides of said silicon nitride shape;

performing a second anisotropic RIE procedure to remove exposed portions of said first polysilicon layer not covered by said silicon nitride shape, or by said polysilicon spacers, resulting in thinning of said polysilicon spacers, and forming said floating gate structure comprised of a floating gate base structure, defined from said first polysilicon layer, and comprised of thinned polysilicon spacers, located extending upwards from the periphery of said floating gate base structure;

selectively removing said silicon nitride shape via use of a hot phosphoric acid solution;

forming a dielectric layer on said floating gate structure;

depositing a third polysilicon layer; and patterning of said third polysilicon layer to form said control gate structure on said dielectric layer, with said control gate structure overlapping said floating gate structure.

13. The method of claim 12, wherein said STI regions, are between about 0.10 to 10 um, in width, with a space between said STI regions of about 0.05 to 0.50 um, and with said STI regions defined to a depth between about 1000 to 5000 Angstroms, in said semiconductor substrate.

14. The method of claim 12, wherein said silicon dioxide tunnelling layer is obtained via thermal oxidation procedures performed in an oxygen—steam ambient, to a thickness between about 30 to 150 Angstroms.

15. The method of claim 12, wherein said first polysilicon layer is obtained via LPCVD procedures to a thickness between about 1000 to 3000 Angstroms, and doped in situ during deposition via the addition of arsine, or phosphine to a silane ambient.

16. The method of claim 12, wherein the height of said silicon nitride shape is between about 1000 to 4000 Angstroms, formed from a silicon nitride layer which was obtained at a thickness between about 1000 to 4000 Angstroms via LPCVD or PECVD procedures, then defined via anisotropic, reactive ion etching (RIE), procedure, using $Cl_2$ or $CF_4$ as an etchant.

17. The method of claim 12, wherein said second polysilicon layer is obtained via LPCVD procedures to a thickness between about 300 to 2500 Angstroms, and doped in situ during deposition via the addition of arsine, or phosphine to a silane ambient.

18. The method of claim 12, wherein said first anisotropic RIE procedure, used to form said polysilicon spacers, is performed using $Cl_2$ or $SF_6$ as an etchant for polysilicon.

19. The method of claim 12, wherein said second anisotropic RIE procedure used to form said floating gate structure is performed using $Cl_2$ or $SF_6$ as an etchant for said first polysilicon layer.

20. The method of claim 12, wherein the height or thickness of said thinned polysilicon spacers are between about 100 to 1000 Angstroms.

21. The method of claim 12, wherein said dielectric layer is formed to a silicon dioxide equivalent thickness between about 80 to 200 Angstroms, and comprised of either an oxidized silicon nitride (NO) layer, or comprised of an oxidized silicon nitride layer on silicon oxide ONO).

22. The method of claim 12, wherein said third polysilicon layer is obtained via LPCVD procedures to a thickness between about 500 to 2000 Angstroms, and doped in situ during deposition via the addition of arsine, or phosphine to a silane ambient.

23. The method of claim 12, wherein said control gate structure is defined from said third polysilicon layer via an anisotropic RIE procedure using $Cl_2$ or $SF_6$ as an etchant for polysilicon.

* * * * *